(12) United States Patent
Forrest

(10) Patent No.: US 7,858,507 B2
(45) Date of Patent: Dec. 28, 2010

(54) METHOD AND SYSTEM FOR CREATING PHOTOSENSITIVE ARRAY WITH INTEGRATED BACKPLANE

(75) Inventor: Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 128 days.

(21) Appl. No.: 12/366,839

(22) Filed: Feb. 6, 2009

(65) Prior Publication Data

US 2009/0261394 A1  Oct. 22, 2009

Related U.S. Application Data

(60) Provisional application No. 61/028,420, filed on Feb. 13, 2008.

(51) Int. Cl.
| H01L 21/00 | (2006.01) |
| H01L 21/84 | (2006.01) |
| H01L 21/8222 | (2006.01) |
| H01L 21/20 | (2006.01) |
| H01L 21/4763 | (2006.01) |

(52) U.S. Cl. ........................ 438/584; 438/29; 438/99; 438/164; 438/328; 438/623; 257/E21.046; 257/E21.053; 257/E21.061; 257/E21.062

(58) Field of Classification Search .......... 257/E21.053, 257/E21.046, E21.061, E21.062
See application file for complete search history.

(56) References Cited

U.S. PATENT DOCUMENTS

| 6,013,982 | A | 1/2000 | Thompson et al. |
| 6,087,196 | A | 7/2000 | Sturm et al. |
| 6,294,398 | B1 | 9/2001 | Kim et al. |
| 6,337,102 | B1 | 1/2002 | Forrest et al. |
| 6,468,819 | B1 | 10/2002 | Kim et al. |
| 7,678,423 | B2 * | 3/2010 | Forrest et al. ............... 427/294 |
| 2004/0121568 | A1 * | 6/2004 | Kim et al. ................... 438/584 |
| 2008/0202673 | A1 * | 8/2008 | Forrest et al. ............... 156/232 |

FOREIGN PATENT DOCUMENTS

EP  1840983  10/2007

OTHER PUBLICATIONS

The International Search Report and Written Opinion corresponding to the PCT/US2009/033791 application dated May 28, 2009.

(Continued)

*Primary Examiner*—Charles Garber
*Assistant Examiner*—Mohsen Ahmadi
(74) *Attorney, Agent, or Firm*—Townsend and Townsend and Crew LLP

(57) ABSTRACT

A method of fabricating a photoactive array having an integrated backplane is provided. The layers of the device may be stamped or deposited on a planar or a curved substrate, such as a semispherical or ellipsoidal substrate. Each metal layer may be stamped using an elastomeric stamp and a vacuum mold. By depositing the patterned and full-surface layers in a single process, a photosensitive array with an integrated transistor backplane may be fabricated, resulting in improved sensitivity and performance.

25 Claims, 6 Drawing Sheets

OTHER PUBLICATIONS

Xin Xu et al., "Organic Photodetector Focal Plane Arrays Fabricated on Hemispherical Substrates by Three-Dimensional Stamping" Lasers and Electro-Optics Society, 2007, LEOS 2007, p. 578-579.
Someya et al., "A large-area, flexible and lightweight sheet image scanner integrated with organic field-effect transistors and organic photodiodes" Electron Devices Meeting, 2004. IEDM Technical Digest, IEEE International San Francisco, CA, Dec. 2004, p. 365-368.
U.S. Appl. No. 10/233,470, filed Sep. 4, 2002.
U.S. Appl. No. 61/028,420, filed Feb. 13, 2008.
U.S. Appl. No. 11/711,115, filed Feb. 27, 2007.
U.S. Appl. No. 10/387,925, filed Mar. 13, 2003.

* cited by examiner

METHOD AND SYSTEM FOR CREATING PHOTOSENSITIVE ARRAY WITH INTEGRATED BACKPLANE

CROSS-REFERENCES TO RELATED APPLICATIONS

This application claims priority to U.S. Provisional Application No. 61/028,420, filed Feb. 13, 2008, the disclosure of which is incorporated by reference in its entirety.

STATEMENT AS TO RIGHTS TO INVENTIONS MADE UNDER FEDERALLY SPONSORED RESEARCH OR DEVELOPMENT

This invention was made with U.S. Government support under Contract No. DAAB07-01-D-G601 awarded by ARMY Night Vision. The government has certain rights in this invention.

JOINT RESEARCH AGREEMENT

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

FIELD OF THE INVENTION

The present invention relates to photosensitive devices, and more particularly to photosensitive arrays having an integrated backplane.

BACKGROUND OF THE INVENTION

Photosensitive devices such as charge-coupled device (CCD) and complementary metal-oxide-semiconductor (CMOS) sensors, pixel array sensors, and infrared sensors, may use a focal plane array to collect and detect photons. Typically, a focal plane array includes an array of photosensitive pixels that can be arranged at or around the focal plane of a lens. Each pixel may include a photodetector such as a photodiode. The pixels often are arranged in a rectangular array. To achieve high levels of sensitivity, photosensitive arrays often require a transistor backplane, where each pixel in the array is connected to and controlled by a transistor in the backplane. Typically, the backplane is fabricated separately from the photosensitive array.

DETAILED DESCRIPTION OF THE INVENTION

A photosensitive array having an integrated backplane may be fabricated using stamping of patterned layers, such as with an elastomeric stamp, combined with full-surface deposition of photosensitive and other layers. The layers may be stamped or deposited on a planar or a curved substrate, such as an ellipsoidal or other non-planar substrate. By depositing the patterned and full-surface layers in a single process, a photosensitive array with an integrated transistor backplane may be fabricated, resulting in improved sensitivity and performance.

Figure 1:
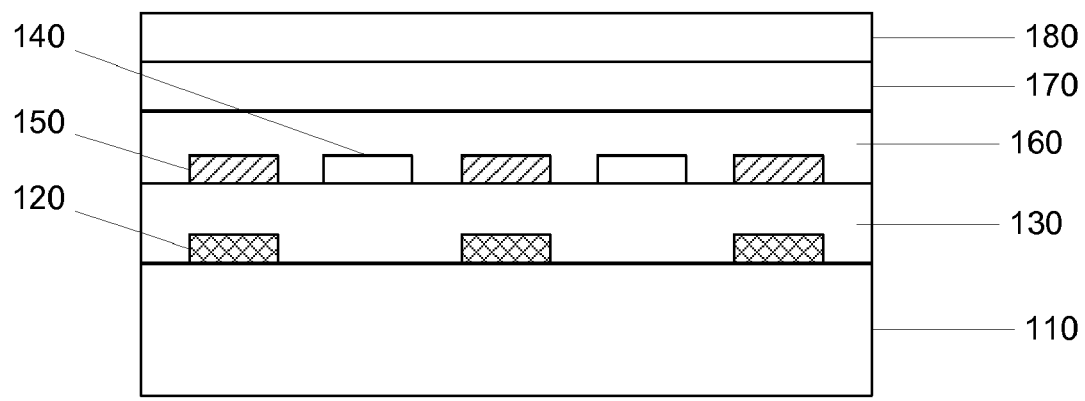
FIG. 1 shows a cross-section of a focal plane array.

FIG. 1 shows a cross-section of a focal plane array deposited on a substrate 110. The substrate 110 may be a plastic or any other suitable material, and may be transparent or semi-transparent. Although shown as a planar substrate, the layers of the array may be deposited on a non-planar substrate as described herein. The array may include an anode layer 120 having one or more anode contacts disposed over the substrate. Typically, a series of anode contacts may be disposed over or on the substrate as shown. The anodes may be deposited using a stamping process, such as where an anode material is applied to an elastomeric stamp and transferred to the substrate by applying force to the stamp. The anode layer may include one or more metals, and may be primarily or entirely made of one or more metals. A photosensitive layer 130 may be disposed over and between the anodes. The photosensitive layer may be any suitable organic or inorganic material, or any suitable combination of organic and/or inorganic materials, including amorphous semiconductors. The photosensitive layer may include small molecules, polymers, or a combination of small molecules and polymers. It may be deposited using any suitable deposition method, such as sputtering, thermal evaporation, spin-coating, vapor phase deposition, chemical vapor deposition, and vapor jet printing. These and other exemplary deposition methods are described in further detail in U.S. Pat. Nos. 6,013,982; 6,087,196; 6,337,102; 6,294,398; and 6,468,819; and U.S. application Ser. No. 10/233,470, each of which is incorporated by reference in its entirety.

To fabricate integrated transistors, source and drain contacts 140, 150, respectively, may be deposited over the photosensitive layer. These contacts may be deposited using a stamping process similar to that used to deposit the anode layer. For example, a metal layer may be placed on a patterned, elastomeric stamp and deposited over the photoactive layer by stamping. Typically, the contacts 140, 150 may include one or more metals, and may be primarily or entirely made of one or more metals.

A channel layer 160 may be disposed over and between the source and/or drain contacts. The channel layer may include any suitable material or materials, such as small molecules, polymers, organic, inorganic materials, and amorphous semiconductors. An exemplary, non-limiting example of a suitable channel material is pentacene. The channel layer may be deposited using any suitable deposition method, such as sputtering, thermal evaporation, spin-coating, vapor phase deposition, chemical vapor deposition, and vapor jet printing.

A gate insulator 170 may be disposed over the channel layer. The gate insulator may include any suitable material or materials, and may include small molecules, polymers, organic, and inorganic materials. Exemplary, non-limiting examples of suitable gate insulator materials include glassy insulators and parylene. The gate insulator may be deposited using any suitable deposition method, such as sputtering, thermal evaporation, spin-coating, vapor phase deposition, chemical vapor deposition, and vapor jet printing.

One or more gate contacts 180 may be disposed over the gate insulator. Typically, a series of gate contacts may be disposed over the gate insulator perpendicular to the anodes 120 and aligned with the drain contacts 150. The gate contacts may be deposited using a stamping process, such as where a metal layer is placed on a patterned, elastomeric stamp and deposited over the gate insulator by stamping. Typically, the gate contacts may include one or more metals, and may be primarily or entirely made of one or more metals.

As described herein, metal or metallic layers in a photosensitive device may be deposited by stamping. This may allow for fabrication at lower temperatures than conventional fabrication techniques allow. For example, conventional techniques often require high temperatures to deposit metal layers and/or achieve sufficient bonding with underlying layers. These high temperatures may increase the risk of damage to adjacent layers, especially where the adjacent layers include organic or other heat-sensitive materials. Since stamping techniques as described herein may bond adjacent layers using lower-temperature techniques such as cold welding, these techniques may reduce or eliminate the need for high-temperature deposition.

As described herein, a photosensitive device may be fabricated by depositing the layers described with respect to FIG. 1 in order. Each layer may be transparent or semi-transparent. The device also may be fabricated by depositing the layers in the reverse order from that previously described, i.e., from top to bottom. For example, the gate contact layer may be stamped onto a substrate, the gate insulator deposited over the gate contact layer, and so forth. In some cases, the device may be intended to receive light primarily through one surface. For example, a device as illustrated in FIG. 1 may receive light primarily through the substrate, allowing for more light to be incident on the photoactive layer. Devices as described herein also may be configured to receive or detect light from multiple sides.

Figure 2A:
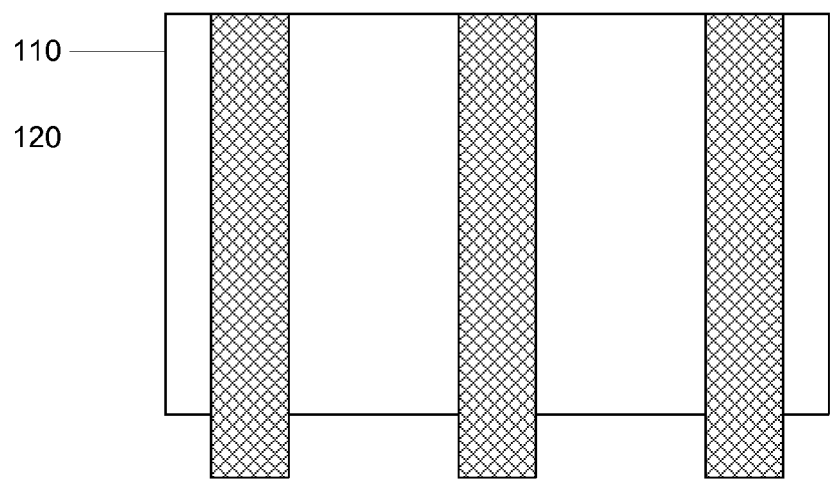
FIG. 2A shows a substrate with a deposited anode layer.
Figure 2B:
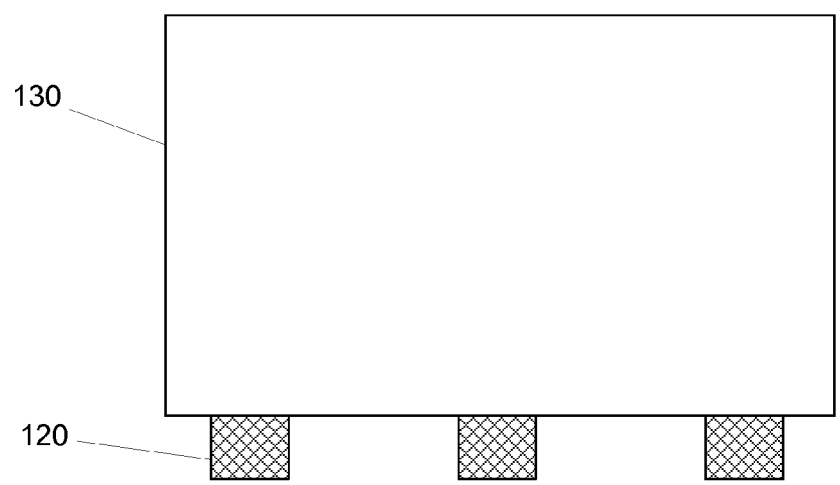
FIG. 2B shows the device of FIG. 2A with a photoactive layer deposited over the anode layer.

FIGS. 2A-2F and 3 show a method of fabricating a focal plane array having an integral transistor backplane. As shown in FIG. 2A, an anode layer 120 having a plurality of anodes may be deposited on a substrate 110. The contacts may extend beyond the region of the substrate that defines the active portion of the device, such as to provide external connections to the array. The anode layer may be deposited using a stamping process as described herein. A photosensitive layer 130 may be deposited over the anode contacts as shown in FIG. 2B.

Figure 2C:
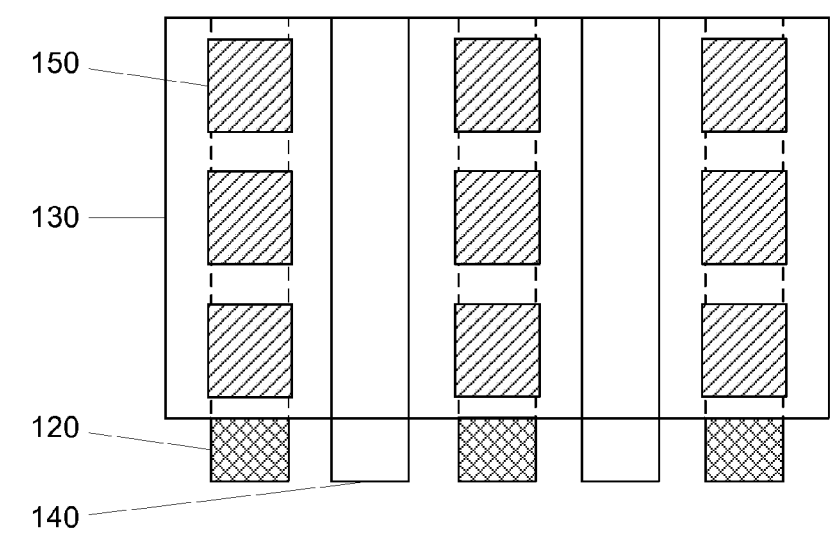
FIG. 2C shows the device of FIG. 2B with a source/drain layer deposited over the photoactive layer.

A layer including source contacts 140 and drain contacts 150 may be deposited over the photosensitive layer 130. As shown in FIG. 2C, the drain contacts 150 may be aligned with the underlying anode contacts 120. The portion of each anode contact obscured by the photoactive layer 130 is shown by dashed lines. Using the methods described herein, it is believed that alignments of within 1 µm may be achieved, preferably within 0.5-1.0 µm, and more preferably within 0.1-0.5 µm. As used herein, an upper feature is aligned with an underlying feature if the upper feature is positioned such that its center or edge is within the specified distance of the corresponding center or edge of the underlying feature, if projected directly through to the upper layer on which the upper feature is fabricated. For example, when a planar device as illustrated in FIG. 2C is viewed from above, each side of the drain contacts 150 may extend less than 1.0 µm past the corresponding edge of the anode 120 directly under each drain contact. In configurations where the drain contacts are deposited with widths different from the underlying anode, the center of each drain contact may be aligned to the vertical center line of the underlying anode.

Figure 2D:
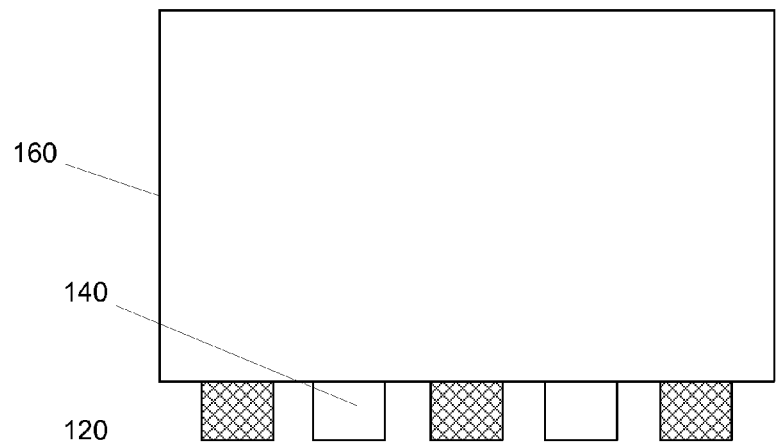
FIG. 2D shows the device of FIG. 2C with a channel layer deposited over the source/drain layer.
Figure 2E:
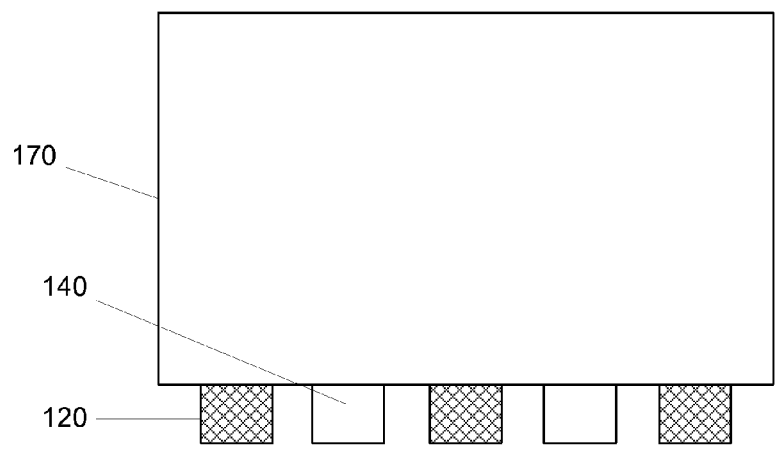
FIG. 2E shows the device of FIG. 2D with an insulator deposited over the channel layer.

In FIGS. 2D and 2E, a channel layer 160 and gate insulator layer 170, respectively, may be deposited over the source and drain contacts. The channel layer may extend between the source and drain contacts as shown in FIG. 1.

Figure 2F:
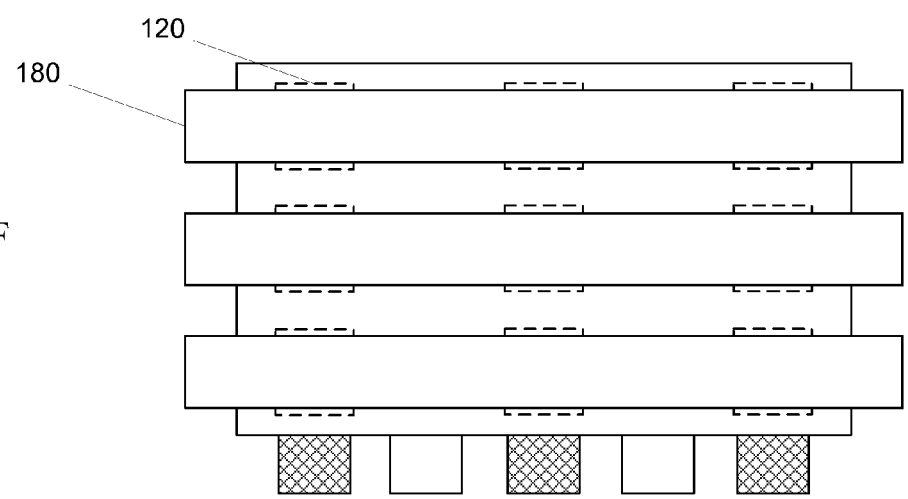
FIG. 2F shows the device of FIG. 2E with a gate layer disposed over the insulator.
Figure 3:
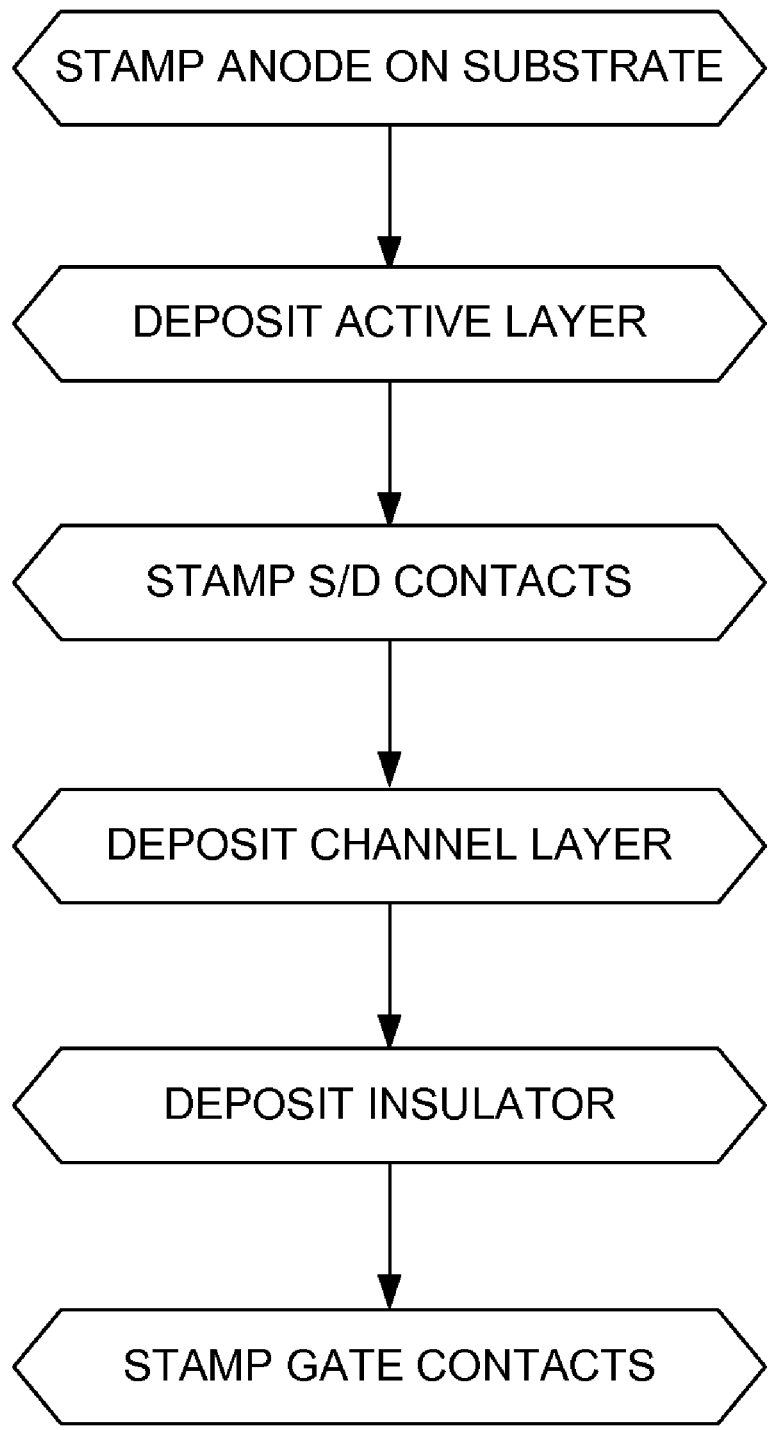
FIG. 3 shows a method of fabricating a focal plane array having an integral transistor backplane.

FIG. 2F shows the gate contacts 180 deposited over the gate insulator. The gate contacts 180 may be perpendicular to the anode contacts 120 and to the source contacts 140, and aligned with the drain contacts 150 (shown with dotted lines). Using the methods described herein, it is believed that the gate contacts may be aligned to the underlying drain contacts to within 1 µm, preferably within 0.5-1.0 µm, and more preferably within 0.1-0.5 µm.

Figure 4A:
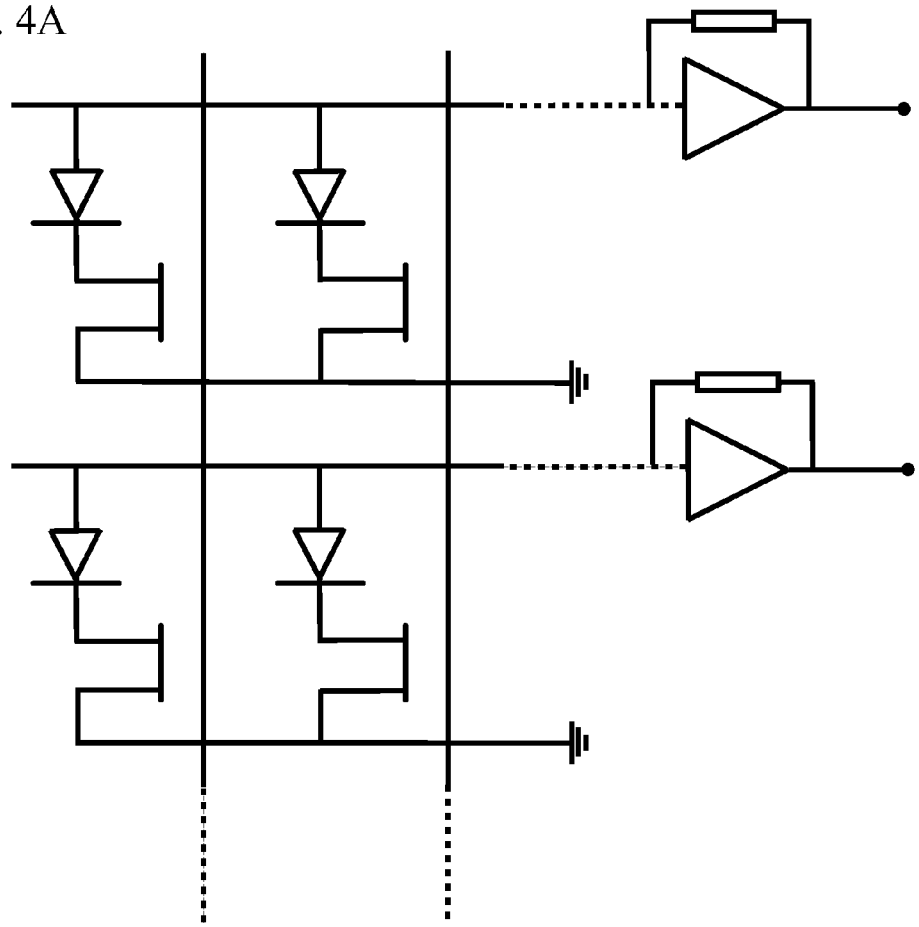
FIG. 4A shows a schematic representation of a photosensitive array having an integrated transistor backplane.
Figure 4B:
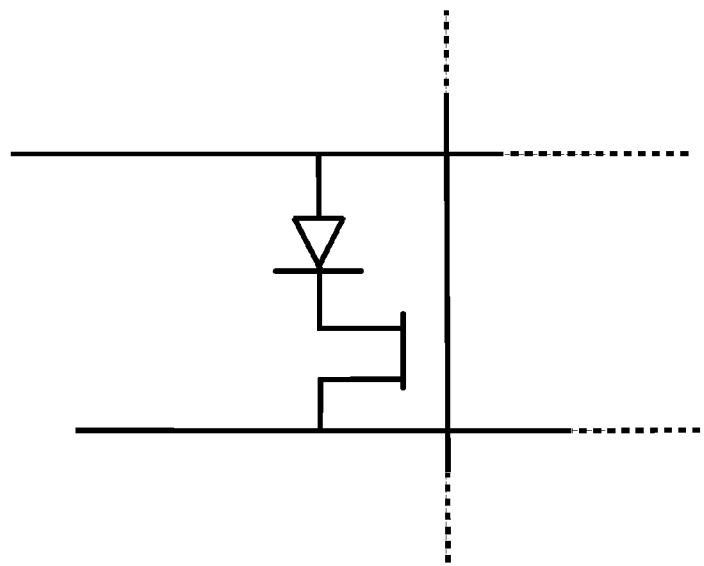
FIG. 4B shows a schematic representation of an integrated element having a photodiode and a transistor.

FIG. 4A shows a schematic representation of a photosensitive array having an integrated transistor backplane. Large-scale arrays may be fabricated using patterned stamps and large-scale deposition of active and insulating layers as described herein, and/or by repeated application of the stamping and deposition techniques described herein. For example, a large-scale array contains multiple each integrated elements as shown in FIG. 4B. Each integrated element may be fabricated as a photoactive pixel coupled to the corresponding, integrated transistor using a single stamping process. When connected to other integrated elements, the transistors may be connected as shown in FIG. 4A to form a complete, integrated backplane. Multiple integrated elements also may be fabricated concurrently, such as by using a single patterned stamp. Thus, the methods and techniques described herein may be used to fabricate individual pixels, groups of pixels, and pixel arrays.

Figure 5A:
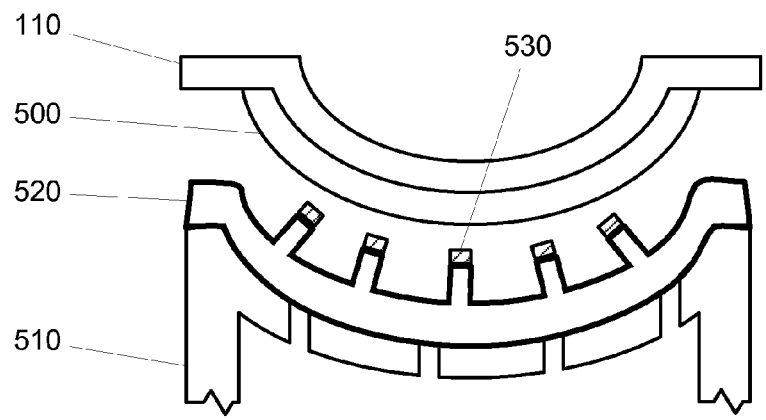
FIG. 5A shows a coated, patterned elastomeric stamp attached to a vacuum mold.
Figure 5B:
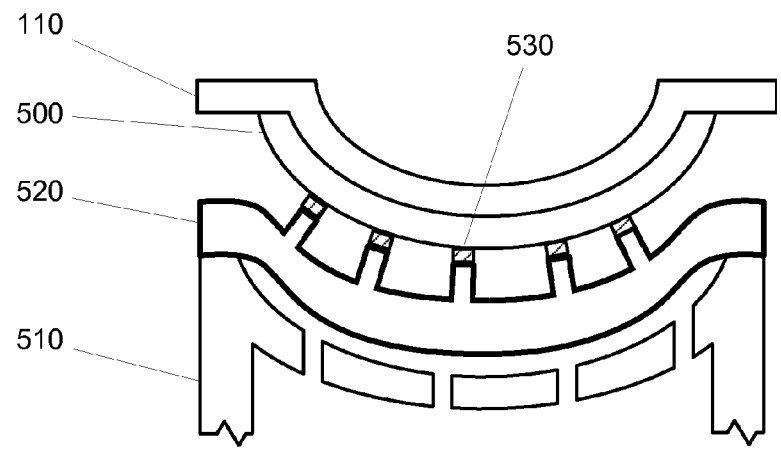
FIG. 5B shows a coated, patterned elastomeric stamp attached to a vacuum mold with a non-planar substrate disposed over the stamp.
Figure 5C:
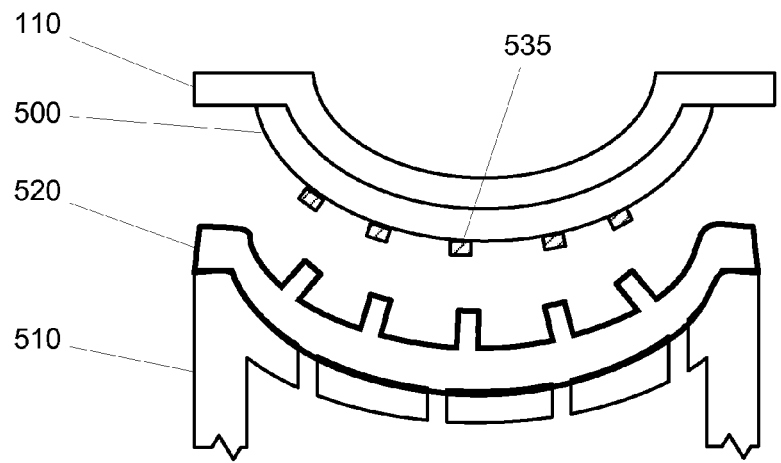
FIG. 5C shows a patterned elastomeric stamp attached to a vacuum mold after depositing a patterned layer on a substrate.

FIGS. 5A-5C show a method of depositing a layer by stamping onto a non-planar substrate using a vacuum mold. An elastomeric stamp 520 may be placed over an opening in a vacuum mold 510 and sealed to the edge of the opening. The vacuum mold has an interior cavity connected to a vacuum source and may include a permeable or semi-permeable surface on which the stamp is placed. Such a surface may prevent the elastomeric stamp 520 from deforming into the vacuum mold beyond a desired amount. It also may be used to deform the stamp into a specific desired shape, such as when the surface has the same general shape as the substrate on which material is to be deposited. When a vacuum is applied to an internal cavity of the vacuum mold, the elastomeric stamp may be deformed into the mold as shown in FIG. 5A. The stamp 150 may be coated with the material 530 to be deposited before it is deformed, i.e., while in a planar configuration, or it may be coated after being deformed into the vacuum mold.

A substrate 110 on which material to be deposited is placed above a coated, deformed stamp, as shown in FIG. 5A. The substrate may be previously coated with one or more layers 500, as previously described. For example, when the elastomeric stamp is used to deposit the source and drain contacts, the coated substrate may include a prior-deposited anode layer and photoactive layer. The coated substrate also may have other layers not explicitly described herein, such as an adhesion layer, a strike layer, or a metal layer to which the patterned material will be bonded, such as via cold welding. The substrate may have one-dimensional curvature, such as the curved surface of a cylinder, or two-dimensional curvature, such as a hemispherical or semispherical substrate. The substrate also may have at least one surface that is non-developable. That is, the surface is a topological shape that cannot be flattened onto a plane without distortion such as stretching, compressing, or tearing. The entire substrate may be non-developable, such as where a substrate is created by deforming a thin sheet to have a dome or semispherical shape.

As shown in FIG. 5B, the vacuum applied to the vacuum mold may be removed or decreased. Due to the elastic properties of the stamp, the stamp then may relax away from the vacuum mold, causing the patterned surface to come into contact with the substrate. Typically, sufficient force may be exerted by the elastomeric stamp to cause the material to bond to the coated substrate. Other procedures may be used to exert force between the substrate and the stamp.

After pressure has been applied between the substrate and the stamp, the stamp may be removed from the substrate by applying a vacuum to the vacuum mold as shown in FIG. 5C. As the stamp is pulled away from the coated substrate, a layer 535 of material may remain on the coated substrate. The material may be deposited over the entire surface of the substrate, or it may be deposited on only a portion of the substrate surface. The layer 535 may be a patterned layer, such as the layer of source and/or drain contacts previously described.

Various other substrate shapes in addition to those explicitly described herein may be used, including substrates having a surface that is ellipsoidal or semispherical. An ellipsoidal surface is one formed by rotation of an elliptical curve around an axis. A semispherical surface is one having a cross-section that is an arc. Other shapes may be used. Typically, non-planar substrates will have at least one continuously curved surface. A non-planar substrate may be further characterized by the major axis measured across a flat surface of the substrate, and the maximum height of the substrate measured along a line perpendicular to a flat surface of the substrate to a point on the curved surface of the substrate.

Elastomeric stamps as described herein may be made of any suitable material, with PDMS being an exemplary material. The stamp may be a hybrid stamp, i.e., have multiple layers of different elastomeric materials of varying elasticity or hardness. For example, a stamp may have a hard, less elastic center portion and a soft, more elastic outer portion. The stamp may have a gradient elasticity and/or hardness. Such hybrid stamps may be useful for depositing on substrates having high curvature, since it may be desirable for the inner portions of the stamp to deform more or less easily than the outer portions. The specific configuration of a hybrid stamp may be matched to the degree of deformation each region of the stamp is expected to undergo when depositing material on a specific substrate.

Other substrates and stamping methods may be used. Specifically, the materials, methods, and systems described in co-pending U.S. application Ser. No. 11/711,115, filed Feb. 27, 2007, the disclosure of which is incorporated by reference in its entirety, may be used.

Various processes may be used to effectuate transfer of material from the elastomeric stamp to the substrate while the stamp and the substrate are in contact. An exemplary method of transferring material is the use of cold welding. As used herein, cold welding refers to bonding of like materials at room temperature due to an application of pressure, such as bonding between two metals. Additional information regarding cold welding is provided in U.S. application Ser. No. 10/387,925, filed Mar. 13, 2003, the disclosure of which is incorporated by reference in its entirety. Properties of the material being deposited may also be used. For example, the substrate and the stamp may be brought into contact for a time sufficient to allow a self-assembled monolayer of the material to form on the substrate. A chemical reaction may also occur or be induced to assist with material transfer or strengthen the bond between the substrate and the deposited material. Additional curing or bonding agents may be used to improve or affect the transfer of material. For example, heat, ultraviolet light, or an oxidizing agent may be applied to the stamp, the substrate, or both. The stamp, the substrate, or both also may be treated with a plasma oxidation process prior to placing the substrate on the stamp.

The methods and devices described herein may be used to fabricate devices or components of devices such as imaging devices, pixel arrays, cameras, light sensors and detectors, and other optoelectronic devices.

As used herein, the term "organic" includes polymeric materials as well as small molecule organic materials. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example, as a pendent group on a polymer backbone or as a part of the backbone. In general, a small molecule has a well-defined chemical formula with a single molecular weight, whereas a polymer has a chemical formula and a molecular weight that may vary from molecule to molecule.

As used herein, "top" means furthest away from the substrate, while "bottom" means closest to the substrate. Similarly, "upper" refers to a layer farther away from the substrate than a "lower" or "underlying" layer. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from the substrate. There may be other layers between the first and second layer, unless it is specified that the first layer is "in physical contact with" the second layer. For example, a cathode may be described as "disposed over" an anode, even though there are various layers in between.

While the present invention is described with respect to particular examples and preferred embodiments, it is understood that the present invention is not limited to these examples and embodiments. The present invention therefore includes variations from the particular examples and preferred embodiments described herein, as will be apparent to one of skill in the art.

What is claimed is:

1. A method of fabricating a photosensitive device, comprising:
   depositing an anode layer over a substrate, the anode layer comprising a plurality of anode contacts;
   depositing a photoactive layer over the anode;
   using an elastomeric stamp, stamping a first metal layer over the photoactive layer, the metal layer comprising a plurality of source and drain contacts, each of the drain contacts aligned to an anode contact in the anode layer;
   depositing a channel layer over the first metal layer;

depositing an insulator over the channel layer; and
using an elastomeric stamp, stamping a second metal layer over the insulator, the second metal layer comprising a plurality of gate contacts, each gate contact aligned to a plurality of the drain contacts in the first metal layer.

2. The method of claim 1, wherein the substrate is non-planar.

3. The method of claim 1, wherein the substrate has a non-developable surface and the anode layer is deposited on the non-developable surface.

4. The method of claim 1, wherein each of the drain contacts is aligned to an anode contact to within 0.1-1 μm.

5. The method of claim 1, wherein each of the gate contacts is aligned to the source and drain contacts to within 0.1-1 μm.

6. The method of claim 1, wherein stamping the first metal layer comprises:
applying a metal layer to a pattern on the surface of the elastomeric stamp;
placing the patterned metal layer in contact with the coated substrate; and
applying pressure to the elastomeric stamp.

7. The method of claim 1, wherein stamping the first metal layer comprises:
applying a metal layer to a pattern on the surface of the elastomeric stamp;
deforming the elastomeric stamp with a vacuum mold; and
placing the patterned metal layer in contact with the coated substrate.

8. The method of claim 7, wherein the surface of the elastomeric stamp is coated with the metal layer while the stamp is in a planar configuration.

9. The method of claim 7, wherein the surface of the elastomeric stamp is coated with the metal layer while the stamp is in a non planar configuration.

10. The method of claim 1, wherein stamping the second metal layer comprises:
applying a metal layer to a pattern on the surface of the elastomeric stamp;
placing the patterned metal layer in contact with the coated substrate; and
applying pressure to the elastomeric stamp.

11. The method of claim 1, wherein stamping the second metal layer comprises:
applying a metal layer to a pattern on the surface of the elastomeric stamp;
deforming the elastomeric stamp with a vacuum mold; and
placing the patterned metal layer in contact with the coated substrate.

12. The method of claim 11, wherein the surface of the elastomeric stamp is coated with the metal layer while the stamp is in a planar configuration.

13. The method of claim 11, wherein the surface of the elastomeric stamp is coated with the metal layer while the stamp is in a non-planar configuration.

14. The method of claim 1, further comprising incorporating the combined layers into an optoelectronic device.

15. The method of claim 14, wherein the optoelectronic device is a camera.

16. A method of fabricating a focal plane array having an integrated transistor backplane, comprising:
depositing an anode layer over a substrate, the anode layer comprising a plurality of anode contacts;
depositing a photoactive layer over the anode;
coating a first patterned elastomeric stamp with a first metal;
placing the first patterned elastomeric stamp over a vacuum mold;
applying a vacuum to the vacuum mold to deform the coated first elastomeric stamp;
placing the substrate over the vacuum mold;
depositing a first metal layer over the anode layer by releasing the vacuum, the first metal layer formed from the first metal and comprising a plurality of source and drain contacts, each of the drain contacts aligned to an anode contact in the anode layer;
depositing a channel layer over the first metal layer;
depositing an insulator over the channel layer; and
depositing a second metal layer over the insulator.

17. The method of claim 16, wherein depositing the second metal layer comprises:
coating a second patterned elastomeric stamp with a second metal;
placing the second patterned elastomeric stamp over a second vacuum mold;
applying a vacuum to the second vacuum mold to deform the second coated elastomeric stamp;
placing the substrate over the vacuum mold;
depositing a second metal layer over the anode layer by releasing the vacuum applied to the second vacuum mold, the second metal layer formed from the second metal and comprising a plurality of gate contacts, each gate contact aligned to a plurality of the drain contacts in the first metal layer.

18. The method of claim 16, wherein the substrate is non-planar.

19. The method of claim 16, wherein the substrate has a non-developable surface and the anode layer is deposited on the non-developable surface.

20. The method of claim 16, wherein each of the drain contacts is aligned to an anode contact to within 0.1-0.5 μm.

21. The method of claim 16, wherein each of the drain contacts is aligned to an anode contact to within 0.1-0.5 μm.

22. The method of claim 16, wherein each of the gate contacts is aligned to the source and drain contacts to within 1 μm.

23. The method of claim 16, wherein each of the gate contacts is aligned to the source and drain contacts to within 0.1-0.5 μm.

24. A device fabricated according to a method comprising:
depositing an anode layer over a substrate, the anode layer comprising a plurality of anode contacts;
depositing a photoactive layer over the anode;
using an elastomeric stamp, stamping a first metal layer over the photoactive layer, the metal layer comprising a plurality of source and drain contacts, each of the drain contacts aligned to an anode contact in the anode layer;
depositing a channel layer over the first metal layer,
depositing an insulator over the channel layer; and
using an elastomeric stamp, stamping a second metal layer over the insulator, the second metal layer comprising a plurality of gate contacts, each gate contact aligned to a plurality of the drain contacts in the first metal layer.

25. The device of claim 24, wherein the device is a camera.

* * * * *

UNITED STATES PATENT AND TRADEMARK OFFICE
CERTIFICATE OF CORRECTION

| | | |
|---|---|---|
| PATENT NO. | : 7,858,507 B2 | Page 1 of 1 |
| APPLICATION NO. | : 12/366839 | |
| DATED | : December 28, 2010 | |
| INVENTOR(S) | : Stephen R. Forrest | |

It is certified that error appears in the above-identified patent and that said Letters Patent is hereby corrected as shown below:

In Claim 20, column 8, line 38, please delete "0.1 – 0.5µm" and insert -- 1µm --

Signed and Sealed this
First Day of March, 2011

David J. Kappos
*Director of the United States Patent and Trademark Office*